United States Patent
Chen et al.

(10) Patent No.: US 7,456,093 B2
(45) Date of Patent: Nov. 25, 2008

(54) METHOD FOR IMPROVING A SEMICONDUCTOR DEVICE DELAMINATION RESISTANCE

(75) Inventors: Pi-Tsung Chen, Tainan (TW); Keng-Chu Lin, Ping-Tung (TW); Hui-Lin Chang, Hsin-Chu (TW); Lih-Ping Li, Hsin-Chu (TW); Tien-I Bao, Hsin-Chu (TW); Yung-Cheng Lu, Taipei (TW); Syun-Ming Jang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 145 days.

(21) Appl. No.: 10/884,719

(22) Filed: Jul. 3, 2004

(65) Prior Publication Data

US 2006/0003572 A1    Jan. 5, 2006

(51) Int. Cl.
*H01L 21/4763* (2006.01)
*H01L 21/44* (2006.01)

(52) U.S. Cl. .................. 438/622; 438/624; 438/644; 438/654

(58) Field of Classification Search .......... 438/622, 438/624, 628, 634, 644, 654, 637, 638, 639
See application file for complete search history.

(56) References Cited

U.S. PATENT DOCUMENTS

| 4,570,337 | A | * | 2/1986 | Butt | 29/840 |
|---|---|---|---|---|---|
| 6,124,198 | A | * | 9/2000 | Moslehi | 438/622 |
| 6,251,770 | B1 | * | 6/2001 | Uglow et al. | 438/624 |
| 6,265,321 | B1 | * | 7/2001 | Chooi et al. | 438/725 |
| 6,365,502 | B1 | * | 4/2002 | Paranjpe et al. | 438/622 |
| 6,376,353 | B1 | * | 4/2002 | Zhou et al. | 438/612 |
| 6,417,112 | B1 | * | 7/2002 | Peyne et al. | 438/754 |
| 6,620,727 | B2 | * | 9/2003 | Brennan | 438/637 |
| 7,294,565 | B2 | * | 11/2007 | Burrell et al. | 438/582 |

* cited by examiner

*Primary Examiner*—Chuong A. Luu
(74) *Attorney, Agent, or Firm*—Tung & Associates

(57) ABSTRACT

A semiconductor device with improved resistance to delamination and method for forming the same the method including providing a semiconductor wafer comprising a metallization layer with an uppermost etch stop layer; forming at least one adhesion promoting layer on the etch stop layer; and, forming an inter-metal dielectric (IMD) layer on the at least one adhesion promoting layer.

33 Claims, 3 Drawing Sheets

METHOD FOR IMPROVING A SEMICONDUCTOR DEVICE DELAMINATION RESISTANCE

FIELD OF THE INVENTION

This invention generally relates to multi-level integrated circuit structures and manufacturing methods and more particularly to a structure and methods to prevent multi-layer delamination including improving an adhesion strength between etch stop layers and IMD layers, and minimizing stress gradients and thermal mismatch stresses leading to device layer delamination.

BACKGROUND OF THE INVENTION

In semiconductor fabrication, various layers of dielectric insulating materials and etch stop layers are formed to produce a multi-level wiring structure in an integrated circuit semiconductor device. One of the limiting factors in the continuing evolution toward smaller device size and higher density has been signal delay caused by parasitic capacitance effects of dielectric insulating layers also referred to as intermetal dielectric (IMD) layers as well as etch stop layers. For example, in reducing the capacitance contribution of IMD layers, a common approach for is to form the IMD layer of organic or porous inorganic silicon oxide based materials to reduce a dielectric constant.

As the dielectric constant of IMD layers has been reduced, particularly through the use of porous inorganic silicon oxide based material, there have been the problematical offsetting effects of reduced mechanical strength of the IMD layer as well as adhesion to underlying and/or overlying layers such as etch stop layers. The problem of reduced mechanical strength and adhesion can manifest itself in many ways including delamination during subsequent processing steps such as CMP which exerts a delaminating mechanical force or during chip packaging operations where chip molding material can cause thermal mismatch stresses leading to delamination of a chip. In addition, device layer formation in multi-level devices results in an accumulation of mechanical stresses as device layers are sequentially formed which can contribute to lower critical delamination stress.

It would therefore be advantageous to develop an improved structure and method for preventing delamination of multi-level integrated circuit devices including improved adhesion strength between material layers as well as reducing mechanical and thermal mismatch stresses in chips and in chip packaging operations.

It is therefore an object of the invention to provide an improved structure and method for preventing delamination of multi-level integrated circuit devices including improved adhesion strength between material layers as well as reducing mechanical and thermal mismatch stresses in chips and in chip packaging operations, as well as overcoming other shortcomings of the prior art.

SUMMARY OF THE INVENTION

To achieve the foregoing and other objects, and in accordance with the purposes of the present invention, as embodied and broadly described herein, the present invention provides a semiconductor device with improved resistance to delamination and method for forming the same.

In a first embodiment, the method includes providing a semiconductor wafer comprising a metallization layer with an uppermost etch stop layer; forming at least one adhesion promoting layer on the etch stop layer; and, forming an intermetal dielectric (IMD) layer on the at least one adhesion promoting layer.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the present invention is explained by reference to a dual damascene process it will be appreciated that the etch stop layer (ESL)/IMD layer structure according to the present invention is not limited to IMD layers containing dual damascene wiring structures. Moreover, although the exemplary embodiment is explained by reference to a copper filled dual clamascene structure, it will be appreciated that other metals, including for example, copper alloys, aluminum, and tungsten metals may advantageously be used as the damascene metal filling.

Figure 1A:
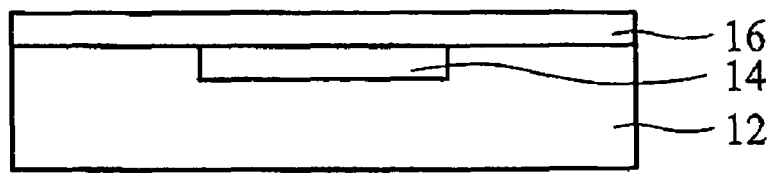
FIGS. 1A-1C are cross-sectional side views of a portion of a multi-level integrated circuit at stages in manufacture according to an embodiment of the present invention.

Referring to FIG. 1A is shown a first IMD layer (dielectric insulating layer) 12, for example formed of a porous silicon oxide containing material such as carbon doped oxide or organo silicate glass (OSG) formed by a PECVD process or a spin on organic or inorganic silicon oxide containing material such as spin on glass (SOG) . A conductive structure 14, for example an interconnect line, is formed in the IMD layer by conventional processes.

Still referring to FIG. 1A, an etch stop layer (ESL) 16 is deposited over the first IMD layer 12, preferably formed of silicon nitride (e.g., SiN), silicon carbide (e.g., SiC), oxygen doped silicon carbide (e.g., SiCO or SiOC), and nitrogen doped silicon carbide (e.g., SiCN), preferably by a PECVD deposition process. The ESL layer is preferably deposited at a thickness of about 200 Angstroms to about 700 Angstroms.

Figure 1B:
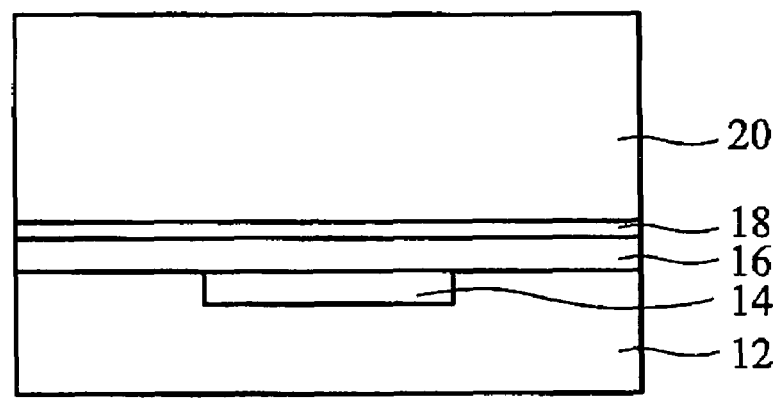

Referring to FIG. 1B, following formation of the etch stop layer e.g., 16, one or more adhesion promoting transition layers e.g., 18 is formed over the ESL 16, prior to forming overlying second IMD layer 20. Preferably the adhesion promoting layer 18 provides a transition, intermediate concentration, or increasing concentration gradient of either a dielectric constant or chemical concentration of a common atomic substituent, e.g., atomic oxygen (O), atomic nitrogen, atomic silicon, or atomic carbon, more preferably atomic oxygen, between the ESL layer and second IMD layer. Preferably the adhesion promoting layer 18 is formed having a thickness between about 50 Angstroms and about 500 Angstroms.

For example, in one embodiment, the transition layer 18 is formed of a similar silicon oxide based material formed to have a higher dielectric constant with respect to the subsequently deposited overlying IMD layer 20. For example, the dielectric constant of carbon doped oxide or OSG may be varied by changing PECVD deposition conditions to provide more or less carbon material as well as more or less porosity. For example, the dielectric constant of PECVD deposited carbon doped oxide may be varied between a value of about 2.2 and about 3.2 by known processes. For example, the adhesion promoting layer 18, is preferably formed with a dielectric constant of between about 3.2 and about 2.7, prior to forming an overlying IMD layer with a dielectric constant of between about 2.2 and about 2.7, the adhesion promoting layer more preferably having a dielectric constant about halfway between the dielectric constant of the IMD layer and an upper dielectric constant limit, e.g., 3.2 of the IMD layer. For example, the adhesion promoting layer preferably has a dielectric constant higher by at least about 10% compared to the overlying IMD layer. It has been found that adding an intermediate dielectric constant adhesion promoting layer can increase the delamination critical failure point from an applied energy of about 4.5 Joules/m2 to about 6.0 Joules/m2.

It will be appreciated that other silicon oxide based IMD layers may have a dielectric constant varied by other means, for example by varying levels of fluorine doping to form fluorinated silicate glass (FSG), and or the addition of various organic substituents to a SOG precursor to vary a pore size and therefore a dielectric constant in the SOG layer. Most preferably the adhesion promoting transition layer with a higher dielectric constant than the overlying IMD layer is formed of the same material as the overlying IMD layer but may be formed of a different material. In addition, the transition (adhesion promoting) layer 18 may be formed having a decreasing dielectric constant gradient toward the transition layer/IMD layer interface.

In another embodiment, the adhesion promoting layer 18 is formed of a material having an atomic substituent common to the ESL and the IMD layer, most preferably atomic oxygen (O), either having an intermediate concentration of atomic oxygen compared to the ESL and IMD layers, and/or having an increasing concentration of atomic oxygen (concentration gradient) increasing in a direction toward the transition layer 18/IMD layer 20 interface. For example, if the etch stop layer 16 is formed of silicon carbide (e.g., SiC), preferably the transition layer 19 is formed of oxygen doped silicon carbide (e.g., SiOC or SiOCH) having an oxygen concentration gradient increasing toward the transition layer 18/IMD layer 20 interface.

For example, the oxygen concentration in the adhesion promoting layer 18 may increase from an atomic concentration as low as 10 atomic percent at a bottom portion to as high as about 33 atomic percent at an upper portion, or have a single intermediate atomic oxygen concentration of between about 10 atomic percent and about 33 atomic percent. It will be appreciated that the adhesion promoting layer may also be formed of discrete layers having different atomic oxygen concentrations, for example having two or more layers increasing in atomic concentration of oxygen in a step-wise fashion (stepped concentration gradient) to the transition layer 18/IMD layer 20 interface. It will be appreciated that the same preferred methods of forming an adhesion promoting layer (transition layer) with an increasing atomic oxygen concentration gradient will apply to forming transition layers over etch stop layers formed of silicon nitride (e.g., SiN), silicon oxynitride (e.g., SiON), silicon carbide, nitrogen doped silicon carbide, and oxygen doped silicon carbide. In addition, if the etch stop layer 16 is SiOC, SiON, or SiCON, the adhesion promoting layer 18 is preferably formed with a relatively higher concentration of oxygen including an oxygen gradient increasing in a direction toward the transition layer/IMD layer 20 interface.

It will be appreciated that the adhesion promoting layer 18 may be deposited in-situ or ex-situ with respect to the etch stop layer and/or the IMD layer 20 deposition. For example, the transition layer may be deposited in-situ in a PECVD process with respect to the etch stop layer 16 PECVD deposition and/or in-situ with respect to the IMD layer 20 PECVD deposition.

For example, exemplary process conditions for forming SiCO include an organo-silane precursor such as methyl silane and carbon dioxide ($CO_2$), including an inert carrier or diluent gas such as He or Ar, more preferably He. Exemplary plasma operating conditions include precursor plasma source gas flow rates of 100-300 sccm for methyl silane, 300-500 sccm for He, and 400-800 sccm for $CO_2$, a plasma pressure of about 1 Torr to about 8 Torr, a deposition temperature of about 300° C. to about 400° C., and an RF power of about 100 Watts to about 500 Watts.

In another embodiment, the adhesion promoting layer 18 is formed by treating the etch stop layer 18 surface, for example with a wet oxidizing chemical treatment or by an oxidizing plasma treatment of the etch stop layer 18 surface. For example in the plasma treatment process, one or more oxygen containing plasma source gases such as $N_2O$, $O_2$, CO, and $CO_2$, are supplied to form a plasma which both roughens the etch stop layer surface and forms a thin oxidized layer on the etch stop layer surface. The plasma treatment may include a first inert plasma treatment formed of one or more of helium, argon and nitrogen, to micro-roughen the etch stop layer surface, followed by the oxygen containing plasma treatment to form a thin oxidized layer on the etch stop layer surface. The wet oxidizing chemical treatment may include any conventional oxidizing chemical solution but preferably is a non-contaminating solution including, for example including $H_2O_2$, or ozone ($O_3$) saturated deionized water.

Figure 1C:
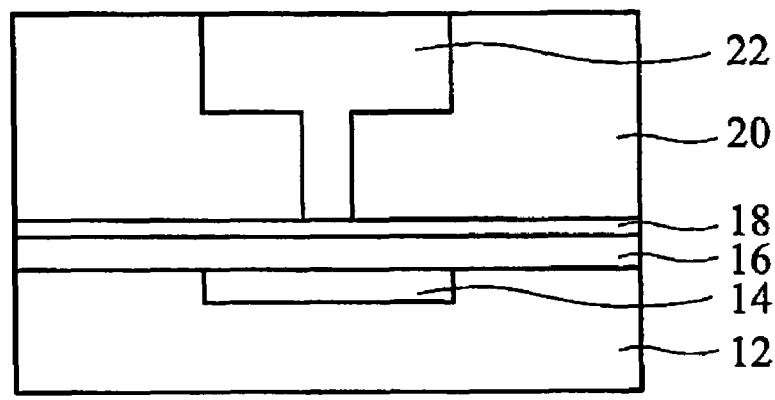

Referring to FIG. 1C, following IMD layer formation a wiring interconnect structure 22 such as a copper filled dual damascene is formed by conventional processes including first forming a via opening followed by forming an overlying trench line opening. A barrier layer (not shown), e.g., TaN is then formed to line the opening followed by a copper electrochemical deposition (ECD) process to backfill the opening and further followed by a CMP process to remove excess deposited copper from the surface including layers overlying the IMD layer. The process is then repeated in forming overlying metallization layers.

It will be appreciated that the formation of an adhesion promoting layer may be inserted at any IMD layer/etch stop layer interface, for example, the transition layer may be formed over an IMD layer prior to formation of an overlying etch stop layer.

Figure 2:
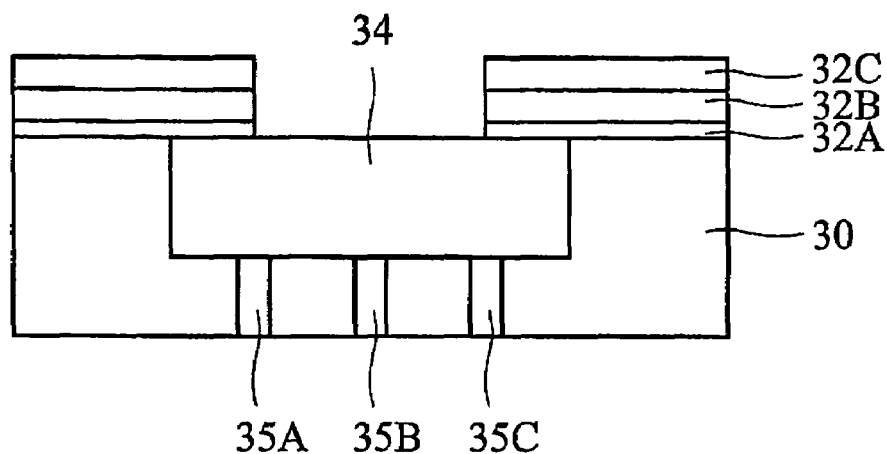
FIG. 2 is a cross sectional side view representation of a portion of a multi-level integrated circuit at stages in manufacture according to an embodiment of the present invention.

Referring to FIG. 2, is shown an uppermost portion of a multi-level semiconductor device having passivation layers e.g., 32A, 32B, and 32C formed overlying an uppermost IMD layer 30 and having a bonding pad 34, e.g., copper, formed therein to form an uppermost metallization layer. It will be appreciated, that the bonding pad 34 is electrically connected to underlying multi-level wiring by interconnect structures e.g., vias 35A, 35B, and 35C. The passivation layers e.g., 32A, 32B, and 32C preferably include at least one stress adjustable material layer and/or a stress adjusted transition layer.

For example the stress adjustable material layer 32B includes a stress adjusted transition layer 32A having an intermediate stress level between the cumulative stress level of underlying metallization layers (including uppermost metallization layer 30) and the stress level in the stress adjustable layer 32B. For example the stress adjustable layer 32B is formed of silicon nitride by a conventional silicon nitride PECVD process resulting in a compressive stress layer where the compressive stress level is adjusted to a desired level by a thickness of the layer or more preferably, by a mixed frequency PECVD silicon nitride deposition process where the stress level of the silicon nitride layer may be adjusted to have a desired tensile or compressive stress based on both deposition conditions and a thickness of the passivation film 32B.

For example, the stress transition layer 32A is famed of silicon oxynitride at a selected intermediate stress level or formed with a stress gradient increasing in a direction toward stress adjustable passivation layer 32B. For example, the stress transition layer 32A may be formed to have a nitrogen concentration gradient increasing and an oxygen concentration decreasing in a direction toward the stress adjustable passivation layer 32B to form an intermediate stress level between the IMD layer 30 and the stress adjustable silicon nitride layer 32B. The stress adjustable silicon nitride layer 32B is then formed in either compressive or tensile stress to counteract the cumulative stress remaining in the underlying metallization layers following deposition of the transition layer 32A. It will be appreciated that the stress transition layer 32A may be formed of oxygen doped silicon carbide (e.g., SiOC, SiOCH), nitrogen and/or oxygen doped silicon carbide (e.g., SiOC, SiOCN), and carbon doped silicon nitride (e.g., SiCN) and the stress adjustable layer 32B may be formed of the same materials including undoped silicon carbide (e.g., SiC) and SiN.

For example, in a PECVD mixed frequency formation process, preferably, a dual RF power source is employed having a range of frequency from about 50 KHz to about 13.56 MHz. For example, the mixed frequency method includes supplying conventional precursors at pressures of from about 50 mTorr to about 5 Torr and RF powers of from about 100 Watts to about 3000 Watts. It will be appreciated that a relatively tensile or compressive stress PECVD film e.g., SiC, SiOC, SiOCN, SiN, or SiON, may be formed by controlling the deposition frequency and/or the relative precursor amounts, for example forming films having a tensile or compressive stress up to about 1 GPa.

Whether stress adjustable passivation layer 32B is deposited in tensile or compressive stress will depend on the overall stress level of the underlying metallization layers which will depend on various factors such as the number of metallization layers and the materials used for the underlying IMD layers and the etch stop layers including transition layers added according to embodiments of the present invention. The stress adjustable passivation layer 32B is preferably deposited in an opposite stress relationship to the overall stress level in the underlying metallization layers. For example, if the overall stress in the underlying metallization layers is compressive, the stress adjustable passivation layer is preferably deposited in tensile stress to a desired level to at least partially counteract the cumulative compressive stress in underlying metallization layers. The transition layer 32A may be deposited in tensile or compressive stress having a value midway between the cumulative stress in underlying metallization layers and the stress level of the adjustable passivation layer 32B.

It will be appreciated that more than two passivation layers e.g., 32B and 32C may be formed and that the stress adjustable passivation layer may be a lowermost, intermediate, or uppermost passivation layer. For example, in the exemplary embodiment, there are shown two passivation layers e.g., 32B, e.g., stress adjustable silicon nitride or silicon carbide and an uppermost passivation layer e.g., 32C which may be an organic material such as a polyimide. Following layer deposition, conventional processes are then carried out such as forming openings e.g., 36 overlying the bonding pads and subsequent dicing of individual semiconductor chips from a process wafer followed by formation of electrical connection packages, including molding material layers around portions of the chip.

Figure 3:
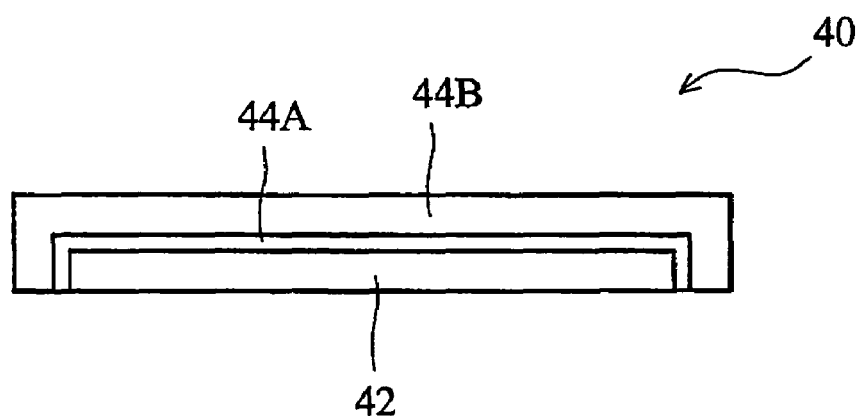
FIG. 3 is a cross sectional side view representation of a portion of a semiconductor chip at stages in packaging according to an embodiment of the invention.

Referring to FIG. 3 is shown an exemplary chip with package molding e.g., 40 formed adjacent the chip e.g., 42, including adhesion promoting transition layers and stress adjustable passivation layers according to preferred embodiments. In order to maximize advantages gained by the adhesion promoting transition layers and stress adjustable passivation layers in the chip formation process, a molding compound for producing a chip package, e.g., having at least two molding compound layers e.g., 44A and 44B is provided adjacent a chip surface. Preferably, an innermost molding layer adjacent the chip surface e.g., 44A is preferably formed to have a lower coefficient of thermal expansion (CTE) compared to outer molding layers e.g., 44B. For example the inner molding layer is formed of a conventional epoxy compound for example, a Novolac epoxy resin and a filler material. Preferably the innermost molding layer filler includes a high thermal conductivity material such as fibers including elongated, round or triangular shapes of high thermal conductivity material e.g., doped glass or silicon carbide to reduce CTE with respect to an outer layer e.g., 44B. Alternatively the innermost molding layer 44A may be formed of material having higher volume porosity (e.g., volume porosity of isolated or interconnecting pores with respect to an arbitrary material volume) compared to an outer molding layer e.g., 44B.

For example it has been found that the problem of delamination of multi-level integrated circuits is best achieved by combining various approaches such as improving adhesion by forming adhesion promoting transition layers according to preferred embodiment as well as eliminating large stress transitions between layers such as providing stress transition layers and/or adjusting a stress of a passivation layer to lower the overall stress in a multi-level integrated circuit. Finally adding a molding CTE transition layer to minimize thermal expansion mismatches improves the performance of the adhesion promoting and stress reducing strategies employed in forming the multi-level integrated circuit. It will be appreciated that the adhesion promoting embodiments relating to adhesion promoting transition layers between etch stop and IMD layers, the stress reducing embodiments with respect to the passivation layers, and the CTE transition molding layers may be practiced separately or together to avoid the phenomenon of integrated circuit delamination.

Figure 4:
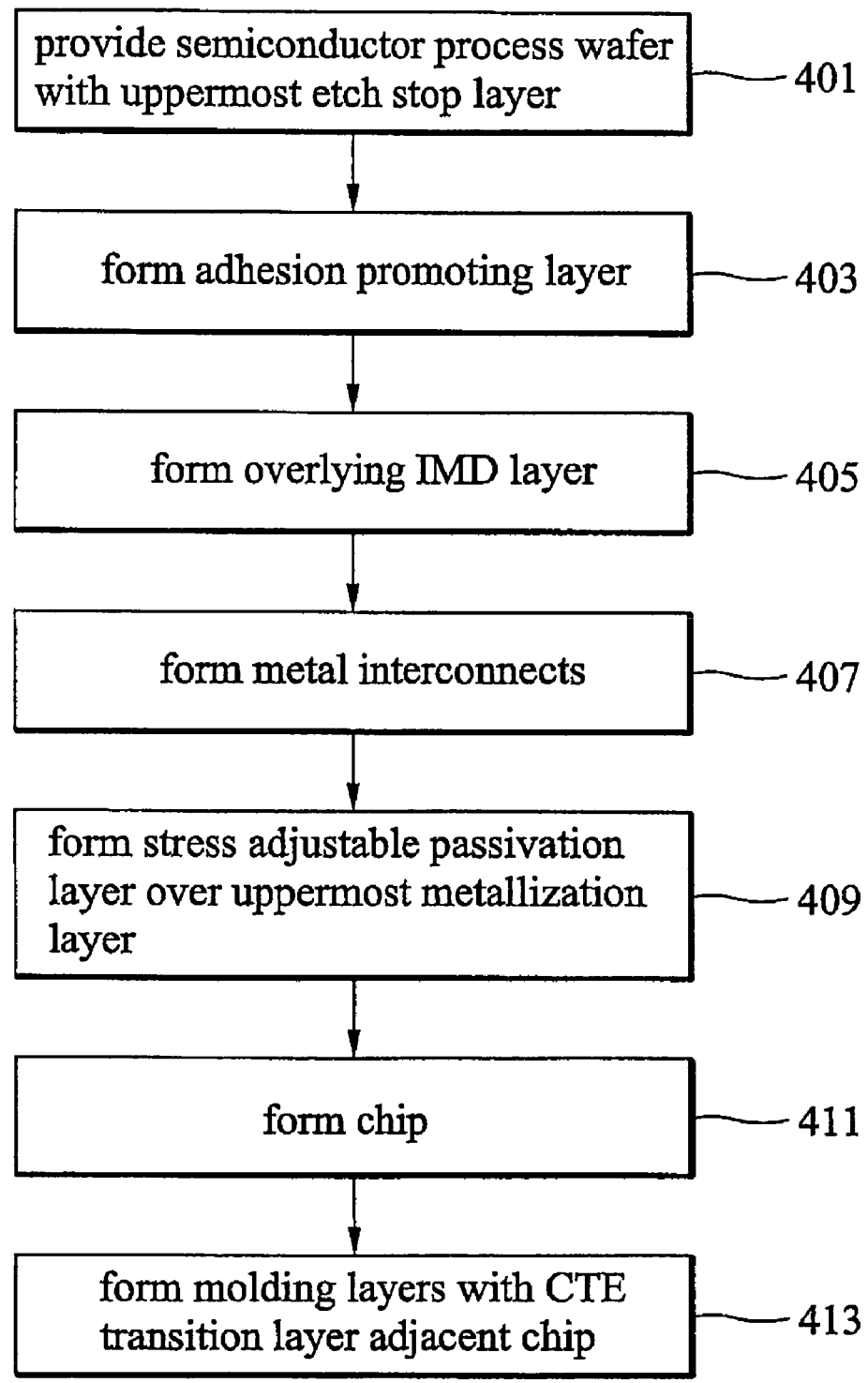
FIG. 4 is a process flow diagram including several embodiments of the present invention.

Referring to FIG. 4 is shown a process flow diagram including several embodiments of the present invention. In process 401, a semiconductor process wafer with an uppermost etch stop layer is provided. In process 403, an adhesion promoting layer is formed according to preferred embodiments. In process 405, an overlying IMD layer is formed. In process 407, metal interconnects are formed. In process 409, a stress adjustable passivation layer including an optional stress transition layer is provided according to preferred embodiments. In process 411, a chip is formed. In process 413, the chip is at least partially encapsulated with at least two layers of a molding material including an innermost CTE transition molding layer having a lower CTE compared to outerlying molding layers.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming a multi-level integrated circuit semiconductor device with improved resistance to delamination comprising the steps of:
   providing a semiconductor wafer comprising a metallization layer comprising wiring interconnect structures with an uppermost etch stop layer;
   forming at least one adhesion promoting layer on the etch stop layer, wherein the adhesion promoting layer comprises an atomic substituent common to both the IMD layer and the etch stop layer, said adhesion promoting layer having an improved adhesion strength to an overlying inter-metal dielectric (IMD) layer compared to an adhesion strength between said etch stop layer and said IMD layer;
   forming said inter-metal dielectric (IMD) layer on the at least one adhesion promoting layer; and,
   forming damascene wiring interconnect structures in the IMD layer.

2. The method of claim 1, wherein the atomic substituent comprises an atomic concentration gradient increasing in a direction toward the IMD layer.

3. The method of claim 1, wherein the adhesion promoting layer comprises multiple layers each layer sequentially increasing in atomic concentration of the atomic substituents in a direction toward the IMD layer.

4. The method of claim 1, wherein the atomic substituent is selected from the group consisting of silicon, nitrogen, and oxygen.

5. The method of claim 1, wherein the adhesion promoting layer comprises the same atomic substituents as the etch stop layer in addition to an increased atomic oxygen concentration.

6. The method of claim 1, wherein the adhesion promoting layer is selected from the group consisting of silicon oxynitride, oxygen doped silicon carbide, and nitrogen doped silicon carbide.

7. The method of claim 1, wherein the etch stop layer is selected from the group consisting of silicon nitride, silicon oxynitride, silicon carbide, oxygen doped silicon carbide, and nitrogen doped silicon carbide.

8. The method of claim 1, wherein the etch stop layer and the adhesion promoting layer are formed in-situ by a PECVD process.

9. The method of claim 1, wherein the adhesion promoting layer and the IMD layer are formed in-situ by a PECVD process.

10. The method of claim 1, wherein the IMD layer comprises silicon oxide.

11. The method of claim 1, wherein the IMD layer is selected from the group consisting of carbon doped oxide and organo-silicate glass (OSG).

12. The method of claim 1, wherein the adhesion promoting layer is formed by an oxidizing plasma process on the first etch stop layer.

13. The method of claim 1, wherein the adhesion promoting layer is formed by a wet chemical oxidizing process on the first etch stop layer.

14. The method of claim 1, wherein the adhesion promoting layer comprises a dielectric layer formed of the same material as the IMD layer and having a dielectric constant higher than the IMD layer.

15. The method of claim 1, further comprising forming a stress adjustable passivation layer over an uppermost metallization layer comprising bonding pads.

16. The method of claim 15, wherein the stress adjustable passivation layer is formed with a stress level comprising a stress type of one of tensile and compressive to counteract a stress type and level present in underlying metallization layers.

17. The method of claim 15, further comprising the step of forming a stress transition layer between the uppermost metallization layer and the stress adjustable passivation layer, said stress transition layer comprising a stress level intermediate between the stress type and level present in underlying metallization layers and the stress adjustable passivation layer.

18. The method of claim 17, wherein the stress adjustable passivation layer and the stress transition layer are selected from the group consisting of silicon nitride, silicon oxynitride, silicon carbide, oxygen doped silicon carbide, and nitrogen doped silicon carbide.

19. The method of claim 15, further comprising the steps of:
   forming a chip;
   forming a first layer of molding material adjacent the chip having a first coefficient of thermal expansion (CTE); and,
   forming a second layer of molding material on the first layer of molding material having a second CTE larger than the first CTE.

20. The method of claim 19, wherein the first layer comprises a filler material having a higher thermal conductivity compared to filler material for the second layer.

21. The method of claim 19, wherein the first layer comprises a material having a higher volume of porosity with respect to an arbitrary volume of the material compared to the second layer.

22. A method for forming a multi-level integrated circuit semiconductor device with improved resistance to delamination comprising the steps of:
   providing a semiconductor wafer comprising a metallization layer comprising wiring interconnect structures with an uppermost etch stop layer;
   forming at least one adhesion promoting layer on the etch stop layer, wherein the adhesion promoting layer comprises an atomic substituent common to both the IMD layer and the etch stop layer, said adhesion promoting layer having an improved adhesion strength to an overlying inter-metal dielectric (IMD) layer compared to an adhesion strength between said etch stop layer and said IMD layer;
   forming said IMD layer on the at least one adhesion promoting layer, said IMD layer comprising damascene wiring interconnect structures therein; and,
   forming a stress adjustable passivation layer over an uppermost metallization layer comprising bonding pads, said stress adjustable passivation layer formed with a stress level comprising a stress type of one, of tensile and compressive to counteract a stress type and level present in underlying metallization layers.

23. A method for forming a multi-level integrated circuit semiconductor device with improved resistance to delamination comprising the steps of:
   providing a semiconductor wafer comprising a metallization layer comprising wiring interconnect structures with an uppermost etch stop layer;
   forming at least one adhesion promoting layer on the etch stop layer, wherein the adhesion promoting layer comprises an atomic substituent common to both the IMD layer and the etch stop layer, said adhesion promoting layer having an improved adhesion strength to an overlying inter-metal dielectric (IMD) layer compared to an adhesion strength between said etch stop layer and said IMD layer;

forming said IMD layer on the at least one adhesion promoting layer, said IMD layer comprising damascene wiring interconnect structures therein;

forming a stress adjustable passivation layer over an uppermost metallization layer comprising bonding pads, said stress adjustable passivation layer formed with a stress level comprising a stress type of one of tensile and compressive to counteract a stress type and level present in underlying metallization layers;

forming a chip;

forming a first layer of molding material adjacent the chip having a first coefficient of thermal expansion (CTE); and, forming a second layer of molding material on the first layer of molding material having a second CTE larger than the first CTE.

24. The method of claim 23, wherein the adhesion promoting layer is selected from the group consisting of silicon, nitrogen, an oxygen.

25. The method of claim 24, wherein the atomic substituent comprises an atomic concentration gradient increasing in a direction toward the IMD layer.

26. The method of claim 23, wherein the adhesion promoting layer is selected from the group consisting of silicon oxynitride, oxygen doped silicon carbide, and nitrogen doped silicon carbide.

27. The method of claim 23, wherein the etch stop layer is selected from the group consisting of silicon nitride, silicon oxynitride, silicon carbide, oxygen doped silicon carbide, and nitrogen doped silicon carbide.

28. The method of claim 23, wherein the etch stop layer and the adhesion promoting layer are formed by a PECVD process.

29. The method of claim 23, where the IMD layer comprises silicon oxide.

30. The method of claim 23, wherein the adhesion promoting layer comprises a dielectric layer formed of the same material as the IMD layer having a dielectric constant higher than the IMD layer.

31. The method of claim 23, further comprising the step of forming a stress transition layer between the uppermost metallization layer and the stress adjustable passivation layer, said stress transition layer comprising a stress level intermediate between the stress type and level present in underlying metallization layers and the stress adjustable passivation layer.

32. The method of claim 23, wherein the stress adjustable passivation layer and the stress transition layer are selected from the group consisting of silicon nitride, silicon oxynitride, silicon carbide, oxygen doped silicon carbide, and nitrogen doped silicon carbide.

33. The method of claim 23, wherein the first layer comprises a filler material having a higher thermal conductivity compared to filler material for the second layer.

* * * * *